United States Patent
Escobar et al.

(10) Patent No.: US 9,634,649 B2
(45) Date of Patent: Apr. 25, 2017

(54) DOUBLE SAMPLING STATE RETENTION FLIP-FLOP

(71) Applicant: NXP B.V., Eindhoven (NL)

(72) Inventors: Juan Echeverri Escobar, Nijmegen (NL); Jose de Jesus Pineda de Gyvez, Eindhoven (NL); Sebastien Antonius Josephus Fabrie, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/792,276

(22) Filed: Jul. 6, 2015

(65) Prior Publication Data

US 2017/0012611 A1    Jan. 12, 2017

(51) Int. Cl.
  *H03K 3/289*    (2006.01)
  *H03K 3/356*    (2006.01)
  *H03K 3/037*    (2006.01)

(52) U.S. Cl.
  CPC .................. *H03K 3/0372* (2013.01)

(58) Field of Classification Search
  CPC .............................. H03K 3/289; H03K 3/356
  See application file for complete search history.

(56) References Cited

U.S. PATENT DOCUMENTS

| 7,639,056 B2 * | 12/2009 | Gururajarao ..... H03K 3/356008 327/203 |
| 8,242,826 B2 * | 8/2012 | Chi ................. H03K 3/356008 327/203 |
| 8,421,514 B1 | 4/2013 | Yeung et al. |
| 2011/0107166 A1 | 5/2011 | Flautner et al. |
| 2013/0234753 A1 | 9/2013 | Chandrasekharan et al. |

OTHER PUBLICATIONS

H. Mahmoodi, K. Roy. "Data-Retention Flip-Flops for Power-Down Applications," Proc. of ISCAS 2004, pp. 677-680.; 2004.
D. Ernst et.al. "Razor: Circuit-Level Correction of Timing Errors for Low-Power Operation," IEEE Micro, vol. 24, Issue 6, pp. 10-20.; Dec. 2004.
M. Choudhury et.al. "TIMBER: Time borrowing and error relaying for online timing error resilience"; Proc. of DATE, Dresden, Germany, pp. 1554-1559; Mar. 2010.
Partial European Search Report for EP Patent Appln. 16175289.4 (Jan. 2, 2017).

* cited by examiner

*Primary Examiner* — Hai L Nguyen

(57) ABSTRACT

Embodiments of a device and method are disclosed. In an embodiment, a flip-flop circuit is disclosed. The flip-flop circuit includes a master latch, a slave latch connected to the master latch, and a dual-function circuit connected between the master latch and the slave latch and configured to perform state retention and double sampling.

16 Claims, 6 Drawing Sheets

DOUBLE SAMPLING STATE RETENTION FLIP-FLOP

BACKGROUND

Flip-flop circuits are storage elements that can be used for data storage in a variety of applications. For example, flip-flop circuits are used as building blocks for sequential logic. Flip-flop circuits can be controlled by toggling clock signals between high and low voltages.

SUMMARY

Embodiments of a device and method are disclosed. In an embodiment, a flip-flop circuit is disclosed. The flip-flop circuit includes a master latch, a slave latch connected to the master latch, and a dual-function circuit connected between the master latch and the slave latch and configured to perform state retention and double sampling.

In an embodiment, the balloon latch includes a first pair of inverters and a first switch configured to be controlled by a first pair of complementary signals.

In an embodiment, the shadow latch includes a second pair of inverters and a second switch configured to be controlled by a second pair of complementary signals.

In an embodiment, the flip-flop circuit further includes switch circuits connected to an input terminal of the flip-flop circuit, to the master latch, to the slave latch, to the balloon latch, and to the shadow latch.

In an embodiment, the flip-flop circuit further includes a control circuit configured to generate control signals for the switch circuits based on a clock signal and a delayed version of the clock signal.

In an embodiment, the flip-flop circuit further includes an error logic circuit configured to generate an error signal based on signals from the master latch, the shadow latch, and the control circuit.

In an embodiment, the dual-function circuit includes a shared latch configured to perform state retention and double sampling in response to a first pair of complementary signals.

In an embodiment, the shared latch includes a pair of inverters and a switch configured to be controlled by the first pair of complementary signals.

In an embodiment, the flip-flop circuit further includes switch circuits connected to an input terminal of the flip-flop circuit, to the master latch, to the slave latch, and to the shared latch.

In an embodiment, the flip-flop circuit further includes a control circuit configured to generate control signals based on a clock signal and a delayed version of the clock signal and a multiplexer logic circuit configured to generate complementary signals for transmission gates of the shared latch and the switch circuits.

In an embodiment, the flip-flop circuit further includes an error logic circuit configured to generate an error signal based on signals from the master latch, the shared latch, and the control circuit.

In an embodiment, a flip-flop device includes a flip-flop circuit that includes a master latch, a slave latch connected to the master latch, and a dual-function circuit connected between the master latch and the slave latch and configured to perform state retention and double sampling, a power management unit configured to generate a power-on signal and a power-off signal for the flip-flop circuit, and a clock generation unit configured to generate clock signals for the flip-flop circuit.

In an embodiment, a flip-flop circuit includes a master latch, a slave latch connected to the master latch, a dual-function circuit connected between the master latch and the slave latch and configured to perform state retention and double sampling, and switch circuits connected to an input terminal of the flip-flop circuit, to the master latch, to the slave latch, and to the dual-function circuit.

In an embodiment, the dual-function circuit includes a balloon latch connected to the slave latch and configured to perform state retention and a shadow latch connected to the master latch and configured to perform double sampling. The balloon latch includes a first pair of inverters and a first switch configured to be controlled by a first pair of complementary signals. The shadow latch includes a second pair of inverters and a second switch configured to be controlled by a second pair of complementary signals.

In an embodiment, the flip-flop circuit further includes a control circuit configured to generate control signals for the switch circuits based on a clock signal and a delayed version of the clock signal. The master latch and the slave latch include transmission gates configured to be controlled by the clock signal and a complementary clock signal of the clock signal.

In an embodiment, the control circuit includes an NAND gate, an NAND gate with an inverted input, and two inverters.

In an embodiment, the flip-flop circuit further includes a control circuit configured to generate control signals based on a clock signal and a delayed version of the clock signal and a multiplexer logic circuit configured to generate complementary signals for transmission gates of the dual-function circuit and the switch circuits.

In an embodiment, the dual-function circuit includes a shared latch configured to perform state retention and double sampling in response to a first pair of complementary signals from the multiplexer logic circuit. The shared latch includes a pair of inverters and a switch configured to be controlled by the first pair of complementary signals.

In an embodiment, a method for operating a flip-flop circuit involves performing double-sampling using the flip-flop circuit and performing state retention using the flip-flop circuit.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
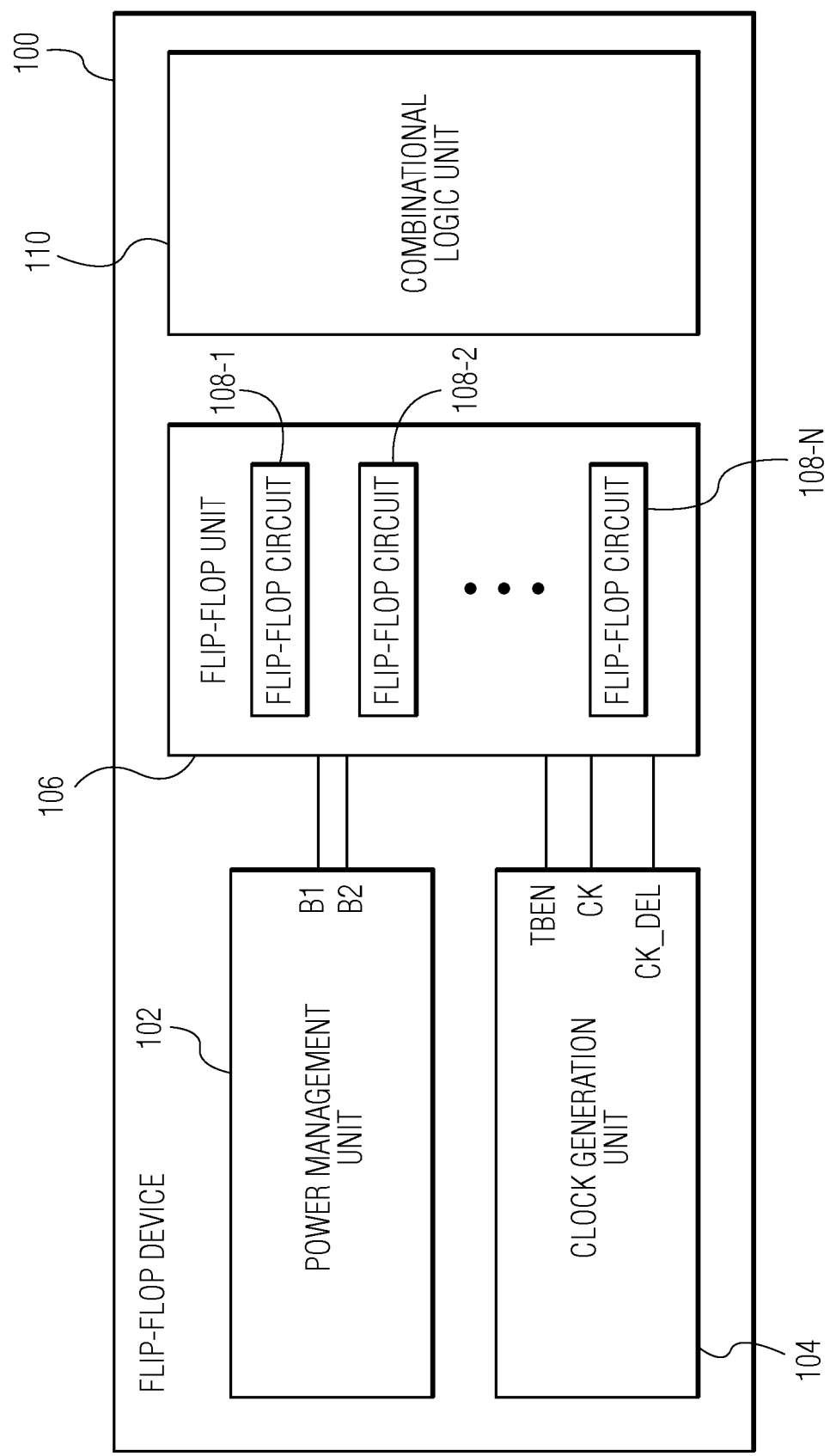
FIG. 1 is a schematic block diagram of a flip-flop device.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Shutting down the power supply of a flip-flop circuit in stand-by mode can reduce current leakage in the flip-flop circuit. However, the information stored in a flip-flop circuit can be lost after a power down. A technique to avoid losing the information stored in a flip-flop circuit involves using a state retention flip-flop circuit, which has a second latch that keeps its value.

Some applications need better data resilience in flip-flop circuits. Double sampling flip-flop circuits can be used to improve data resilience in flip-flop circuits and to reduce process margin caused by technology scaling. For example, a double sampling flip-flop circuit can sample/register the input data twice and use the later sampled value to detect whether or not a master latch has failed because of a setup violation. The later sampled value can also be used to overwrite the value set in a slave latch by the master latch.

FIG. 1 is a schematic block diagram of a flip-flop device 100. In the embodiment depicted in FIG. 1, the flip-flop device includes a power management unit 102, a clock generation unit 104, a flip-flop unit 106 including a number of flip-flop circuits 108-1, 108-2, . . . , 108-N (where N is an integer that is larger than one), and a combinational logic unit 110. The flip-flop device can be implemented as an Integrated Circuit (IC) device, such as an IC chip. The flip-flop device combines the functions of state retention flip-flop circuits and double sampling flip-flop circuits. Specifically, the flip-flop device can perform state retention for low leakage current and perform double sampling for sensing or for increased resilience.

The power management unit 102 of the flip-flop device 100 is configured to generate power management signals for the flip-flop circuits 108-1, . . . , 108-N. In the embodiment depicted in FIG. 1, the power management unit generates a save signal, "B1," for the flip-flop circuits before the flip-flop device enters a low power mode or a restore signal, "B2," for the flip-flop circuits after the flip-flop device exits the low power mode. In some embodiments, the power management unit includes an inverter, which converts the save signal, B1, into a complementary signal, "B1'," and/or converts the restore signal, B2, into a complementary signal, "B2'."

The clock generation unit 104 of the flip-flop device 100 is configured to generate clock signals for the flip-flop circuits 108-1, . . . , 108-N. In the embodiment depicted in FIG. 1, the clock generation unit generates two clock signals, "CK," "CK_DEL," with the same frequency but different phase for the double sampling functionality and an optional double sampling enabling signal, "TBEN." The clock signal, CK, is used for an initial data sampling. The clock signal, CK_DEL, is a delayed version of the clock signal, CK, and is used for a subsequent data sampling. In some embodiments, the clock generation unit includes an inverter, which converts the clock signal, CK, into a complementary signal, "CK'," converts the delayed clock signal, CK_DEL, into a complementary signal, "CLK_DEL'," and/or converts the signal, TBEN, into a complementary signal, "TBEN'."

Compared to a typical state retention flip-flop circuit or a typical double sampling flip-flop circuit, each of the flip-flop circuits 108-1, . . . , 108-N of the flip-flop unit 106 depicted in FIG. 1 operates as a state retention flip-flop circuit and as a double sampling flip-flop circuit. For example, each flip-flop circuit can retain stored information after being powered down. In addition, each flip-flop circuit can sample input data sequentially at different time points, for example, one at the rising edge of the clock signal, CK, and another at the rising edge of the clock signal, CK_DEL, which is a delayed version of the clock signal, CK. Because each flip-flop circuit, as depicted in FIG. 1, can perform state retention as well as double sampling, a corresponding flip-flop device can be used in a wide range of applications that require high data resilience.

The combinational logic unit 110 of the flip-flop device 100 is configured to combine the data stored in the flip-flop circuits 108-1, . . . , 108-N of the flip-flop unit 106. In some embodiments, the combinational logic unit is implemented in Boolean circuits. The combinational logic unit can be used to perform Boolean algebra on input signals and stored data. Examples of the combinational logic unit include, without being limited to, arithmetic logic units (ALUs), adders, subtractors, multiplexers, and demultiplexers.

Figure 2:
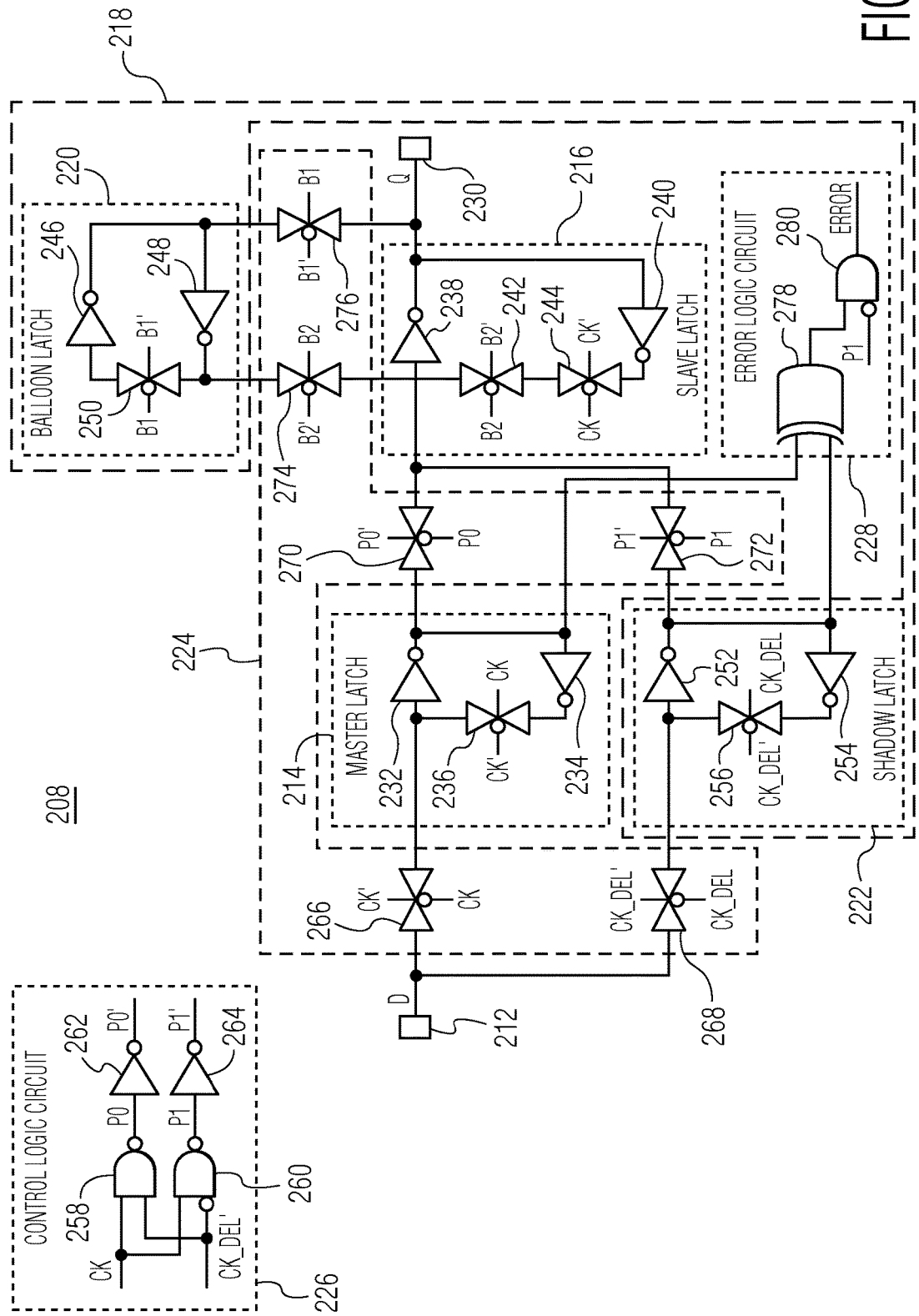
FIG. 2 depicts an embodiment of a flip-flop circuit of the flip-flop device depicted in FIG. 1 that includes a balloon latch for state retention and a shadow latch for double sampling.

In some embodiments, each of the flip-flop circuits 108-1, ..., 108-N includes a balloon latch for state retention and a shadow latch for double sampling. FIG. 2 depicts an embodiment of a flip-flop circuit 108 depicted in FIG. 1 that includes a balloon latch for state retention and a shadow latch for double sampling. In the embodiment depicted in FIG. 2, a flip-flop circuit 208 includes an input terminal 212, a master latch 214, a slave latch 216, a dual-function circuit 218 that includes a balloon latch 220 used to perform state retention and a shadow latch 222 used to perform double sampling, a switch circuit 224, a control logic circuit 226, an error logic circuit 228, and an output terminal 230. The flip-flop circuit can perform state retention by retaining stored information after being powered down and perform double sampling by sampling input data sequentially at different time points. The flip-flop circuit depicted in FIG. 2 is one possible embodiment of the flip-flop circuits depicted in FIG. 1. However, the flip-flop circuits depicted in FIG. 1 are not limited to the embodiment shown in FIG. 2.

In the flip-flop circuit depicted in FIG. 2, the master latch 214 includes two inverters 232, 234 and a first transmission gate 236. The transmission gate can selectively pass or block a signal from its input to its output. In some embodiments, the transmission gate includes a PMOS transistor and an NMOS transistor and the gate terminals of the PMOS transistor and the NMOS transistor are biased in a complementary manner so that both the PMOS transistor and the NMOS transistor are either turned on or turned off. In the embodiment depicted in FIG. 2, the first transmission gate is controlled by complementary clock signals, "CK," "CK'." The slave latch 216 includes two inverters 238, 240, a second transmission gate 242, which is controlled by complementary control signals, "B2," "B2'," and a third transmission gate 244, which is controlled by the complementary clock signals, CK, CK'. In an operation, the master latch saves the data in the low phase of the clock signal, CK, and the balloon latch 220 keeps the value after the power supply is shut down.

The balloon latch 220 belongs to a different power domain from the power domain of the master latch 214 and the slave latch 216, and the different power domain remains on in the power down phase of the master latch and the slave latch. In the embodiment depicted in FIG. 2, the balloon latch includes two inverters 246, 248 and a fourth transmission gate 250, which is controlled by complementary signals, B1, B1', from the power management unit 102. In an operation, before a power down of the flip-flop circuit 208, the save signal, B1, is toggled, which causes the output value, Q, of the flip-flop circuit to be saved in the balloon latch. After a power up of the flip-flop circuit, the restore signal, B2, is toggled to restate the output value, Q, of the flip-flop circuit in the slave latch, based on the value saved in the balloon latch.

The shadow latch 222 is used to hold the input data, "D," in the low phase of a delayed version, CK_DEL, of the clock signal, CK, and to transfer the input data, D, onto the output, Q, at the rising edge of the delayed clock, CK_DEL. In the embodiment depicted in FIG. 2, the shadow latch includes two inverters 252, 254 and a fifth transmission gate 256, which is controlled by complementary clock signals, CK_DEL, CK_DEL'. In an operation, if the input data, D, changes during the time period between a rising edge of the clock signal, CK, and a rising edge of the delayed clock signal, CK_DEL, a possible timing violation is detected. Consequently, the output, Q, is updated with the new value and an 'error' signal is flagged.

The control logic circuit 226 is used to generate control signals for the switch circuit 224 based on the clock signal, CK, and the delayed version, CK_DEL, of the clock signal, CK. In the embodiment depicted in FIG. 2, the control logic circuit includes an NAND gate 258, an NAND gate 260 with an inverted input, and two inverters 262, 264. In the embodiment depicted in FIG. 2, clock signals, CK, CK_DEL, are input into the NAND gate 258 and the NAND gate 260 with an inverted input, respectively. The outputs, "P0," "P1," of the NAND gate 258 and the NAND gate with an inverted input 260 are input into the inverters 262, 264 respectively, from which signals, "P0'," "P1'," are output.

The switch circuit 224 is used to switch on or off the connections between the input terminal 212, the master latch 214, the slave latch 216, the balloon latch 220, the shadow latch 222, the error logic circuit 228, and the output terminal 230. In the embodiment depicted in FIG. 2, the switch circuit includes a sixth transmission gate 266, a seventh transmission gate 268, an eighth transmission gate 270, a ninth transmission gate 272, a tenth transmission gate 274, and an eleventh transmission gate 276. The sixth transmission gate 266 is located between the input terminal 212 and the master latch 214 and is controlled by complementary clock signals, CK, CK'. The seventh transmission gate 268 is located between the input terminal 212 and the shadow latch 222 and is controlled by complementary clock signals, CK_DEL, CK_DEL'. The eighth transmission gate 270 is located between the master latch 214 and the slave latch 216 and is controlled by complementary signals, P0, P0'. The ninth transmission gate 272 is located between the shadow latch 222 and the slave latch and is controlled by complementary signals, P1, P1'. The ninth transmission gate 274 is located between the slave latch and the balloon latch and is controlled by complementary signals, B2, B2'. The eleventh transmission gate 276 is located between the slave latch and the balloon latch and is controlled by complementary signals, B1, B1'.

The error logic circuit 228 is configured to generate an error signal, "ERROR," based on signals from the master latch 214, the shadow latch 222, and the control logic circuit 226. In the embodiment depicted in FIG. 2, the error logic circuit includes an XOR gate 278 and an AND gate 280 with an inverted input. The XOR gate receives inputs from the master latch and from the shadow latch. The output of the XOR gate and the signal, P1, from the control logic circuit are input into the AND gate with an inverted input, at which the error signal, ERROR, is generated.

Figure 3:
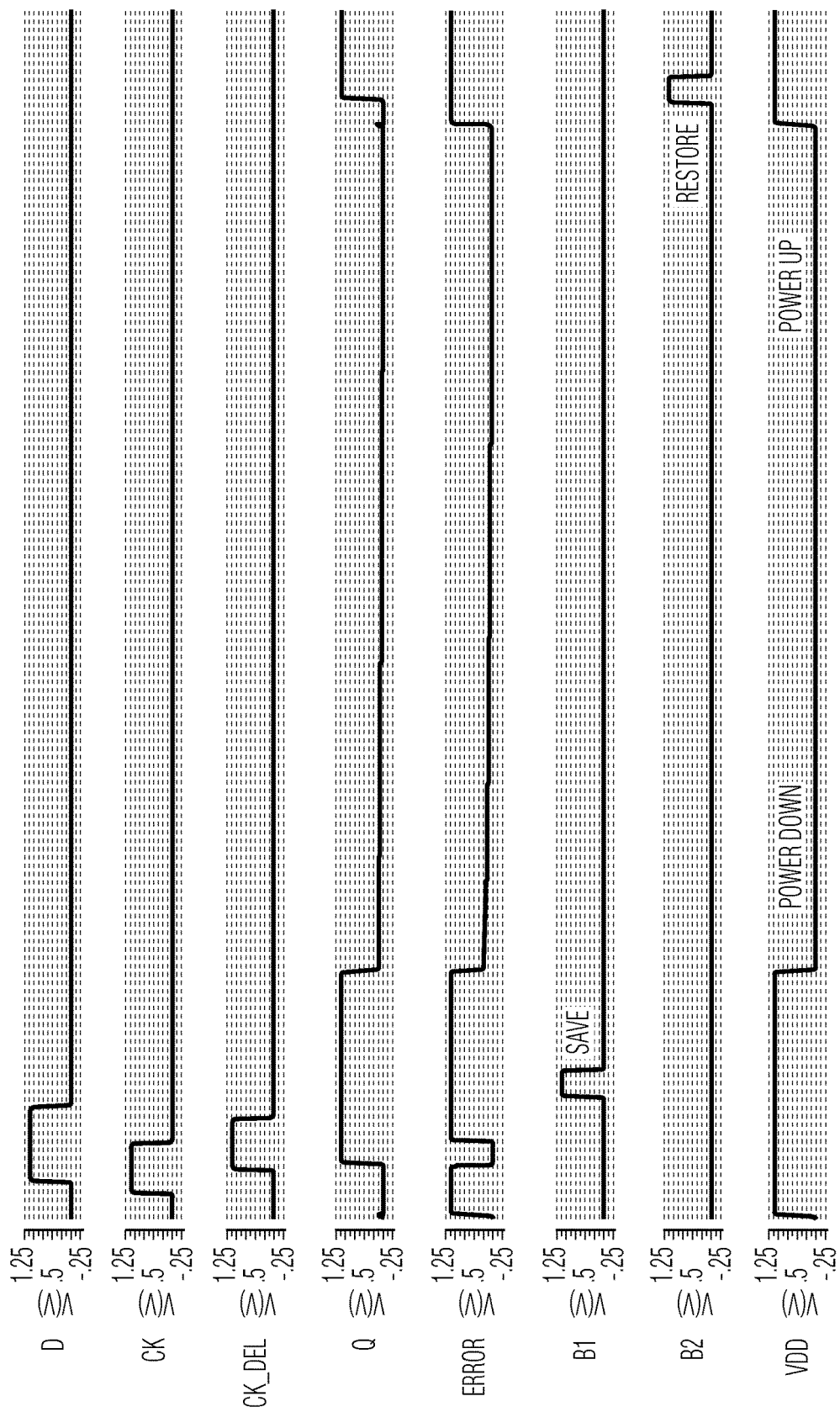
FIG. 3 is a signal timing diagram of the flip-flop circuit depicted in FIG. 2.

FIG. 3 is a signal timing diagram of the flip-flop circuit 208 depicted in FIG. 2. As shown in FIG. 3, the input data, D, changes from logic 0 to logic 1 between the rising edge of the clock signal, CK, and the rising edge of the delayed clock signal, CK_DEL. During the change of the input data, D, the flip-flop circuit registers the value change of the input data, D, in the slave latch 216 (as shown in output Q of the flip-flop circuit). In addition, the flip-flop circuit flags the active low signal, ERROR, between the rising edge of the delayed clock signal, CK_DEL, and the falling edge of the clock signal, CK. Before the flip-flop circuit is powered down, the save signal, B1, is toggled, which causes the output value, Q, of the flip-flop circuit to be saved in the balloon latch 220. After the flip-flop circuit is powered up, the restore signal, B2, is toggled to restore the output value, Q, of the flip-flop circuit in the slave latch 216, based on the value saved in the balloon latch.

Figure 4:
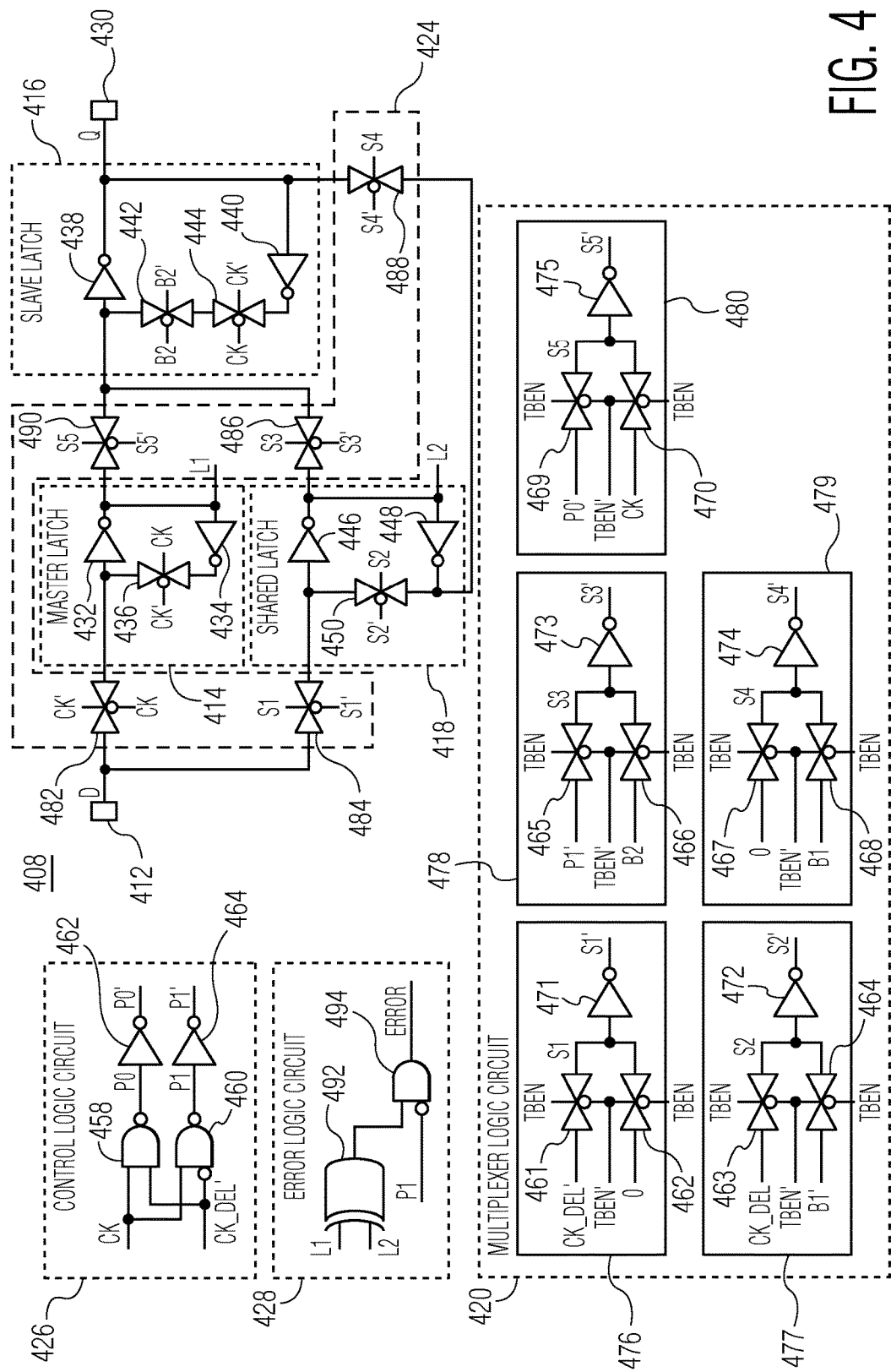
FIG. 4 depicts an embodiment of a flip-flop circuit of the flip-flop device depicted in FIG. 1 that uses a shared latch for state retention and double sampling.

In some embodiments, each of the flip-flop circuits 108-1, ..., 108-N uses one latch for state retention and double sampling. FIG. 4 depicts an embodiment of a flip-flop circuit 108 depicted in FIG. 1 that uses a shared latch for state retention and double sampling and transmission multiplexers to select the desired function. In the embodiment depicted in FIG. 4, a flip-flop circuit 408 includes an input terminal 412, a master latch 414, a slave latch 416, a shared latch 418 used to perform state retention and double sampling, a multiplexer logic circuit 420, a switch circuit 424, a control logic circuit 426, an error logic circuit 428, and an output terminal 430. The flip-flop circuit can perform state retention by retaining stored information after being powered down and perform double sampling by sampling input data sequentially at different time points. The flip-flop circuit depicted in FIG. 4 is one possible embodiment of the flip-flop circuits depicted in FIG. 1. However, the flip-flop circuits depicted in FIG. 1 are not limited to the embodiment shown in FIG. 4.

In the flip-flop circuit depicted in FIG. 4, the master latch 414 includes two inverters 432, 434 and a first transmission gate 436, which is controlled by complementary clock signals, CK, CK'. The slave latch 416 includes two inverters 438, 440, a second transmission gate 442, which is controlled by complementary control signals, B2, B2', and a third transmission gate 444, which is controlled by the complementary clock signals, CK, CK'. In an embodiment, the master latch saves the data in the low phase of the clock signal, CK, and the shared latch 418 keeps the value after the power supply is shut down.

In the embodiment depicted in FIG. 4, the shared latch 418 includes two inverters 446, 448 and a fourth transmission gate 450, which is controlled by complementary control signals, "S2," "S2'." The shared latch can perform either state retention or double sampling. When the shared latch is used to perform state retention, before a power down of the flip-flop circuit, the control signal, S2, is toggled, which causes the output value, Q, of the flip-flop circuit to be saved in the shared latch. After a power up of the flip-flop circuit, the control signal, S3, is toggled to restore the output value, Q, of the flip-flop circuit in the slave latch, based on the value saved in the shared latch.

When the shared latch 418 is used to perform double sampling, the shared latch holds the input data, D, in the low phase of a delayed version, CK_DEL, of the clock signal, CK, and transfers the input data, D, onto the output, Q, in the rising edge of the delayed clock, CK_DEL. If the input data, D, changes during the time period between a rising edge of the clock signal, CK, and a rising edge of the delayed clock signal, CK_DEL, a possible timing violation is detected. Consequently, the output, Q, is updated with the new value and an 'error' signal is flagged.

The control logic circuit 426 is used to generate control signals for the switch circuit 424 based on the clock signal, CK, and the delayed version, CK_DEL, of the clock signal, CK. In the embodiment depicted in FIG. 4, the control logic circuit includes an NAND gate 458, an NAND gate 460 with an inverted input, and two inverters 462, 464. In the embodiment depicted in FIG. 4, clock signals, CK, CK_DEL, are input into the NAND gate 458 and the NAND gate 460 with an inverted input, respectively. The outputs, "P0," "P1," of the NAND gate 458 and the NAND gate 460 with an inverted input are input into inverters, from which signals, "P0'," "P1'," are output.

The multiplexer logic circuit 420 is configured to generate complementary signals for the shared latch 418 and the switch circuit 424. In the embodiment depicted in FIG. 4, the multiplexer logic circuit includes five logic units 476, 477, 478, 479, 480. The first logic unit 476 includes a fifth transmission gate 461, a sixth transmission gate 462, and an inverter 471. The second logic unit 477 includes a seventh transmission gate 463, an eighth transmission gate 464, and an inverter 472. The third logic unit 478 includes a ninth transmission gate 465, a tenth transmission gate 466, and an inverter 473. The fourth logic unit 479 includes an eleventh transmission gate 467, a twelfth transmission gate 468, and an inverter 474. The fifth logic unit 480 includes a thirteenth transmission gate 469, a fourteenth transmission gate 470, and an inverter 475. Each of the ten transmission gates are controlled by complementary signals, "TBEN," "TBEN'." The transmission gates 461, 462 of the first logic unit receive signals, CK_DEL', and 0, and generate an output signal, "S1." The inverter 471 of the first logic unit inverts the signal, S1, to generate a complementary signal, "S1'." The transmission gates 463, 464 of the second logic unit receive signals, CK_DEL', and B1', and generate an output signal, "S2." The inverter 472 of the second logic unit inverts the signal, S2, to generate a complementary signal, "S2'." The transmission gates 465, 466 of the third logic unit receive signals, P1', and B2, and generate an output signal, "S3." The inverter 473 of the third logic unit inverts the signal, S3, to generate a complementary signal, "S3'." The transmission gates 467, 468 of the fourth logic unit receive signals, 0, and B1', and generate an output signal, "S4." The inverter 474 of the fourth logic unit inverts the signal, S4, to generate a complementary signal, "S4'." The transmission gates 469, 470 of the fifth logic unit receive signals, P0', and CK, and generate an output signal, "S5." The inverter 475 of the fifth logic unit inverts the signal, S5, to generate a complementary signal, "S5'."

The switch circuit 424 is used to switch on or off the connections between the input terminal 412, the master latch 414, the slave latch 2416, the shared latch 418, the error logic circuit 428, and the output terminal 430. In the embodiment depicted in FIG. 4, the switch circuit includes a fifteenth transmission gate 482, a sixteenth transmission gate 484, a seventeenth transmission gate 486, an eighteenth transmission gate 488, and a nineteenth transmission gate 490. The fifteenth transmission gate 482 is located between the input terminal and the master latch and is controlled by complementary clock signals, CK, CK'. The sixteenth transmission gate 484 is located between the input terminal and the shared latch and is controlled by complementary clock signals, S1, S1'. The seventeenth transmission gate 486 is located between the shared latch and the slave latch and is controlled by complementary signals, S3, S3'. The nineteenth transmission gate 488 is located between the shared latch and the slave latch and is controlled by complementary signals, S4, S4'. The nineteenth transmission gate 490 is located between the master latch and the slave latch and is controlled by complementary signals, S5, S5'.

The error logic circuit 428 is configured to generate an error signal, "ERROR," based on signals from the master latch 414, the shared latch 418, and the control logic circuit 426. In the embodiment depicted in FIG. 4, the error logic circuit includes an XOR gate 492 and an AND gate 494 with an inverted input. The XOR gate receives inputs, "L1," "L2," from the master latch and from the shared latch, respectively. The output of the XOR gate 492 and the signal, P1, from the control logic circuit are input into the AND gate 494 with an inverted input, at which the error signal, ERROR, is generated.

Figure 5:
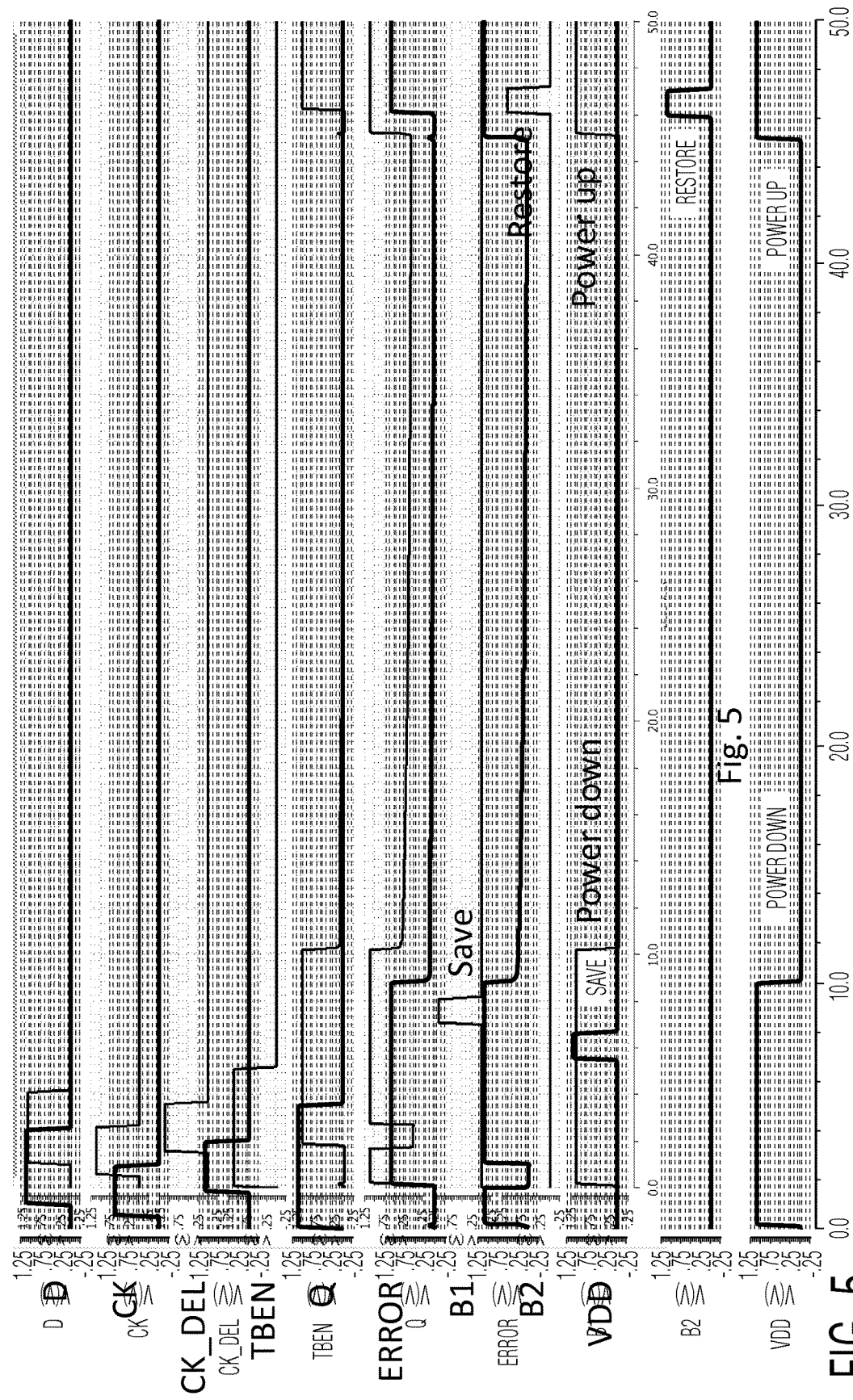
FIG. 5 is a signal timing diagram of the flip-flop circuit depicted in FIG. 4.

FIG. 5 is a signal timing diagram of the flip-flop circuit 408 depicted in FIG. 4. As shown in FIG. 5, the input data, D, changes from logic 0 to logic 1 between the rising edge of the clock signal, CK, and the rising edge of the delayed clock signal, CK_DEL. During the change of the input data, D, the flip-flop circuit registers the value change of the input data, D, in the slave latch 416 (as shown in output Q of the flip-flop circuit). In addition, the flip-flop circuit flags the active low signal, ERROR, between the rising edge of the delayed clock signal, CK_DEL, and the falling edge of the clock signal, CK. Before the flip-flop circuit is powered down, the save signal, B1, is toggled, which causes the output value, Q, of the flip-flop circuit to be saved in the shared latch 418. After the flip-flop circuit is powered up, the restore signal, B2, is toggled to restore the output value, Q, of the flip-flop circuit in the slave latch 416, based on the value saved in the shared latch.

Figure 6:
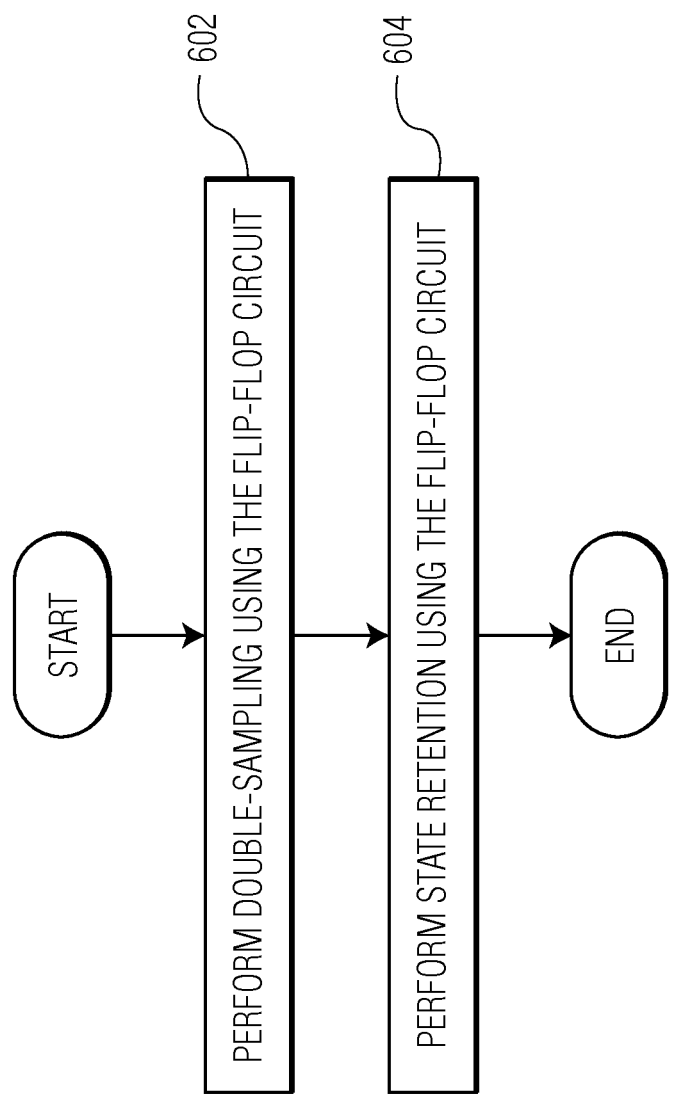
FIG. 6 is a process flow diagram of a method for operating a flip-flop circuit in accordance with an embodiment of the invention.

FIG. 6 is a process flow diagram of a method for operating a flip-flop circuit in accordance with an embodiment of the invention. At block 602, double-sampling is performed using the flip-flop circuit. At block 604, state retention is performed using the flip-flop circuit. The flip-flop circuit may be the same as or similar to the flip-flop circuit depicted in FIG. 1, the flip-flop circuit depicted in FIG. 2, and/or the flip-flop circuit depicted in FIG. 4.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A flip-flop circuit, the flip-flop circuit comprising:
   a master latch;
   a slave latch connected to the master latch;
   a dual-function circuit connected to the master latch and the slave latch and configured to perform state retention and double sampling;
   a control circuit configured to generate a plurality of control signals for the flip-flop circuit based on a clock signal and a delayed version of the clock signal; and
   an error logic circuit configured to generate an error signal based on signals from the master latch, the dual-function circuit, and the control circuit.

2. The flip-flop circuit of claim 1, wherein the dual-function circuit comprises:
   a balloon latch connected to the slave latch and configured to perform state retention; and
   a shadow latch connected to the master latch and configured to perform double sampling.

3. The flip-flop circuit of claim 2, further comprising a plurality of switch circuits connected to an input terminal of the flip-flop circuit, to the master latch, to the slave latch, to the balloon latch, and to the shadow latch.

4. The flip-flop circuit of claim 2, wherein the balloon latch comprises a first pair of inverters and a first switch configured to be controlled by a first pair of complementary signals.

5. The flip-flop circuit of claim 4, wherein the shadow latch comprises a second pair of inverters and a second switch configured to be controlled by a second pair of complementary signals.

6. The flip-flop circuit of claim 1, wherein the dual-function circuit comprises a shared latch configured to perform state retention and double sampling in response to a first pair of complementary signals.

7. The flip-flop circuit of claim 6, wherein the shared latch comprises a pair of inverters and a switch configured to be controlled by the first pair of complementary signals.

8. The flip-flop circuit of claim 6, further comprising a plurality of switch circuits connected to an input terminal of the flip-flop circuit, to the master latch, to the slave latch, and to the shared latch.

9. The flip-flop circuit of claim 8, further comprising:
   a multiplexer logic circuit configured to generate a plurality of complementary signals for transmission gates of the shared latch and the switch circuits.

10. A flip-flop device comprising the flip-flop circuit of claim 1, a power management unit configured to generate a power-on signal and a power-off signal for the flip-flop circuit, and a clock generation unit configured to generate clock signals for the flip-flop circuit.

11. A flip-flop circuit, the flip-flop circuit comprising:
    a master latch;
    a slave latch connected to the master latch;
    a dual-function circuit connected to the master latch and the slave latch and configured to perform state retention and double sampling;
    a plurality of switch circuits connected to an input terminal of the flip-flop circuit, to the master latch, to the slave latch, and to the dual-function circuit;
    a control circuit configured to generate a plurality of control signals for the switch circuits based on a clock signal and a delayed version of the clock signal; and
    an error logic circuit configured to generate an error signal based on signals from the master latch, the dual-function circuit, and the control circuit.

12. The flip-flop circuit of claim 11, wherein the dual-function circuit comprises:
    a balloon latch connected to the slave latch and configured to perform state retention, wherein the balloon latch comprises a first pair of inverters and a first switch configured to be controlled by a first pair of complementary signals; and a shadow latch connected to the master latch and configured to perform double sampling, wherein the shadow latch comprises a second pair of inverters and a second switch configured to be controlled by a second pair of complementary signals.

13. The flip-flop circuit of claim 11, wherein the master latch and the slave latch comprise a plurality of transmission gates configured to be controlled by the clock signal and a complementary clock signal of the clock signal.

14. The flip-flop circuit of claim 11, further comprising:
a multiplexer logic circuit configured to generate a plurality of complementary signals for transmission gates of the dual-function circuit and the switch circuits.

15. The flip-flop circuit of claim 14, wherein the dual-function circuit comprises a shared latch configured to perform state retention and double sampling in response to a first pair of complementary signals from the multiplexer logic circuit, and wherein the shared latch comprises a pair of inverters and a switch configured to be controlled by the first pair of complementary signals.

16. A method for operating a flip-flop circuit, the method comprising:
performing double-sampling using a dual-function circuit of the flip-flop circuit;
performing state retention using the dual-function circuit of the flip-flop circuit;
generating a plurality of control signals for the flip-flop circuit based on a clock signal and a delayed version of the clock signal using a control circuit of the flip-flop circuit; and
generating an error signal based on signals from a master latch of the flip-flop circuit, the dual-function circuit, and the control circuit.

* * * * *